(12) United States Patent
Addepalli et al.

(10) Patent No.: US 12,094,689 B2
(45) Date of Patent: Sep. 17, 2024

(54) SWITCHABLE DELIVERY FOR SEMICONDUCTOR PROCESSING SYSTEM

(71) Applicant: Applied Materials, Inc., Santa Clara, CA (US)

(72) Inventors: Sai Susmita Addepalli, San Jose, CA (US); Yue Chen, Sunnyvale, CA (US); Abhigyan Keshri, Sunnyvale, CA (US); Qiang Ma, Cupertino, CA (US); Zhijun Jiang, San Jose, CA (US); Shailendra Srivastava, Fremont, CA (US); Daemian Raj Benjamin Raj, Fremont, CA (US); Ganesh Balasubramanian, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 796 days.

(21) Appl. No.: 16/932,794

(22) Filed: Jul. 19, 2020

(65) Prior Publication Data

US 2022/0020570 A1 Jan. 20, 2022

(51) Int. Cl.
*H01J 37/32* (2006.01)
*C23C 16/40* (2006.01)
(Continued)

(52) U.S. Cl.
CPC ...... *H01J 37/32449* (2013.01); *C23C 16/401* (2013.01); *C23C 16/4412* (2013.01);
(Continued)

(58) Field of Classification Search
CPC .......... H01J 37/32449; H01J 37/32357; H01J 2237/332; H01J 2237/334; C23C 16/401;
(Continued)

(56) References Cited

U.S. PATENT DOCUMENTS 6,328,043 B1 * 12/2001 Kim .................. C23C 16/42
134/22.1
6,599,574 B1 * 7/2003 Yieh ................. C23C 16/401
427/255.38
(Continued)

FOREIGN PATENT DOCUMENTS

CN 107447203 A 12/2017
KR 2007-0109453 A 11/2007
(Continued)

OTHER PUBLICATIONS

International Search Report and Written Opinion mailed Nov. 1, 2021 in International Patent Application No. PCT/US2021/041897, 8 pages.
(Continued)

*Primary Examiner* — Dale E Page
*Assistant Examiner* — Quovaunda Jefferson
(74) *Attorney, Agent, or Firm* — Kilpatrick Townsend & Stockton LLP (57) ABSTRACT

Exemplary semiconductor processing systems may include a processing chamber including a lid stack having an output manifold. The systems may include a gas panel. The systems may include an input manifold. The input manifold may fluidly couple the gas panel with the output manifold of the processing chamber. A delivery line may extend from the input manifold to the output manifold. The systems may include a first transmission line extending from a first set of precursor sources of the gas panel to the delivery line. The systems may include a second transmission line extending from a second set of precursor sources of the gas panel to the delivery line. The second transmission line may be switchably coupled between the delivery line and an exhaust of the semiconductor processing system.

14 Claims, 4 Drawing Sheets

(51) Int. Cl.
    *C23C 16/44*     (2006.01)
    *C23C 16/50*     (2006.01)
    *H01L 21/67*     (2006.01)

(52) U.S. Cl.
    CPC ........ *C23C 16/50* (2013.01); *H01J 37/32357* (2013.01); *H01J 2237/332* (2013.01); *H01J 2237/334* (2013.01); *H01L 21/67069* (2013.01)

(58) Field of Classification Search
    CPC ................ C23C 16/4412; C23C 16/50; C23C 16/45561; C23C 16/509; H01L 21/67069; H01L 21/67017; H01L 21/6719
    See application file for complete search history.

(56) References Cited

U.S. PATENT DOCUMENTS

| | | | | |
|---|---|---|---|---|
| 8,148,268 | B2* | 4/2012 | Sato | H01J 37/32449 438/711 |
| 2003/0215570 | A1* | 11/2003 | Seutter | C23C 16/345 427/255.394 |
| 2006/0240188 | A1* | 10/2006 | Fuss | C23C 16/4405 427/248.1 |
| 2009/0011148 | A1 | 1/2009 | Rajagopalan et al. | |
| 2014/0261178 | A1* | 9/2014 | Du Bois | H01J 37/32715 118/723 E |
| 2014/0287593 | A1* | 9/2014 | Han | H01L 21/02274 118/723 R |
| 2016/0086801 | A1 | 3/2016 | Kitamura et al. | |
| 2017/0306488 | A1 | 10/2017 | Yao et al. | |

FOREIGN PATENT DOCUMENTS

| | | |
|---|---|---|
| TW | 200529359 A | 9/2005 |
| TW | I512136 B | 12/2015 |
| TW | I646610 B | 1/2019 |
| TW | I685579 B | 2/2020 |
| WO | 2011-137069 A2 | 11/2011 |

OTHER PUBLICATIONS

Application No. PCT/US2021/041897, International Preliminary Report on Patentability, Mailed on Feb. 2, 2023, 7 pages.

\* cited by examiner

SWITCHABLE DELIVERY FOR SEMICONDUCTOR PROCESSING SYSTEM

TECHNICAL FIELD

The present technology relates to systems and methods for semiconductor manufacturing. More specifically, the present technology relates to processing system components and configurations that can be utilized in performing semiconductor processing methods.

BACKGROUND

Integrated circuits are made possible by processes which produce intricately patterned material layers on substrate surfaces. Producing patterned material on a substrate requires controlled methods of formation and removal of exposed material. Stacked memory, such as vertical or 3D NAND, may include the formation of a series of alternating layers of dielectric and placeholder materials through which a number of memory holes or apertures may be etched. As the technology progresses, the number of paired layers initially produced has increased requiring longer processing times for the initial stack formation. As both layers may be produced within the same chamber, operations to evacuate residual precursors may further increase processing time.

Thus, there is a need for improved systems and methods that can be used to produce high quality devices and structures. These and other needs are addressed by the present technology.

SUMMARY

Exemplary semiconductor processing systems may include a processing chamber including a lid stack having an output manifold. The systems may include a gas panel. The systems may include an input manifold. The input manifold may fluidly couple the gas panel with the output manifold of the processing chamber. A delivery line may extend from the input manifold to the output manifold. The systems may include a first transmission line extending from a first set of precursor sources of the gas panel to the delivery line. The systems may include a second transmission line extending from a second set of precursor sources of the gas panel to the delivery line. The second transmission line may be switchably coupled between the delivery line and an exhaust of the semiconductor processing system.

In some embodiments, the first set of precursor sources may include a process precursor and a carrier precursor, and the second set of precursor sources may include a treatment precursor. The systems may include a remote plasma source coupled with the lid stack. The systems may include a third transmission line extending from the gas panel to the remote plasma source. The systems may include a controller configured to operate delivery of precursors from the first set of precursor sources and precursors from the second set of precursor sources to the processing chamber.

Some embodiments of the present technology may encompass methods of semiconductor processing. The methods may include delivering a first deposition precursor through a first transmission line and a first delivery line to a processing chamber of a semiconductor processing system to form a first layer of material on a substrate. The methods may include delivering a treatment precursor through a second transmission line and an exhaust line. The methods may include switching delivery of the treatment precursor from the exhaust line to a second delivery line fluidly coupled with the processing chamber.

In some embodiments, delivering the treatment precursor to the exhaust line may occur during delivery of the first deposition precursor. The first delivery line and the second delivery line may be the same delivery line. The methods may include delivering a second deposition precursor through a third transmission line and a third delivery line to the processing chamber of the semiconductor processing system to form a second layer of material on the substrate. The second delivery line and the third delivery line may be the same delivery line. The methods may include delivering an inert precursor through a fourth transmission line extending to a location proximate a remote plasma unit coupled with the processing chamber. The inert precursor may be delivered into the processing chamber, and the inert precursor may be delivered during delivery of the first deposition precursor.

Some embodiments of the present technology may encompass methods of semiconductor processing. The methods may include delivering a silicon-containing precursor through a first transmission line and a first delivery line to a processing chamber of a semiconductor processing system to form a silicon-containing layer of material on a substrate. The methods may include delivering an oxygen-containing precursor through a second transmission line and a second delivery line to the processing chamber of the semiconductor processing system to form an oxygen-containing layer of material on the substrate. The methods may include delivering a treatment precursor through a third transmission line and the first delivery line to the processing chamber of the semiconductor processing system. The first transmission line and the third transmission line may be coupled with the first delivery line through an input manifold. The third transmission line may be switchably coupled with an exhaust line at the input manifold. The treatment precursor may be or include a nitrogen-containing precursor.

In some embodiments, a dopant precursor may be delivered through the first transmission line during delivery of the silicon-containing precursor. The methods may include flowing the treatment precursor through the third transmission line and the exhaust line while delivering the oxygen-containing precursor to the processing chamber of the semiconductor processing system. The methods may include switching delivery of the treatment precursor from the exhaust line to the first delivery line. An inert precursor may be fluidly coupled with the first transmission line. The methods may include delivering the inert precursor through the first transmission line and the first delivery line while delivering the treatment precursor through the third transmission line and the first delivery line. Delivering the inert precursor through the first delivery line may deliver a residual amount of silicon-containing precursor contained in the first delivery line to the processing chamber while delivering the treatment precursor.

The methods may include exhausting the processing chamber subsequent delivering the treatment precursor. The methods may include repeating the method. Exhausting the processing chamber may be performed in less than or about 5 seconds prior to delivering the silicon-containing precursor. The semiconductor processing system may include a remote plasma source coupled with the processing chamber. The semiconductor processing chamber may include a fourth transmission line fluidly coupling an inert gas with the remote plasma source. The methods may include delivering inert gas through the fourth transmission line while delivering at least one of the silicon-containing precursor, the oxygen-containing precursor, or the treatment precursor.

Such technology may provide numerous benefits over conventional systems and techniques. For example, embodiments of the present technology may allow initial material stacks for memory structures to be produced in less time than conventional techniques. Additionally, improvements in film quality may be realized with the present systems and methods by limiting cross-contamination between layers. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As 3D NAND structures grow in the number of cells being formed, the time to produce the initial layers or stack continues to increase, sometimes dramatically. During 3D NAND processing, stacks of placeholder layers and dielectric materials may be formed to produce an initial stack of layers within which the cells may be formed. These placeholder layers may have a variety of operations performed to place structures before fully removing the material and replacing it with metal. The layers are often formed overlying a conductor layer, such as polysilicon, for example. When the memory holes are formed, apertures may extend through all of the alternating layers of material before accessing the polysilicon or other material substrate. Subsequent processing may form a staircase structure for contacts, and may also exhume the placeholder materials laterally.

During the initial stack formation, the alternating layers may be produced in a single processing chamber. Whether the layers include oxide and nitride, oxide and silicon, or any other combination of materials, alternating deposition processes may be performed to produce the layers of materials. Because the dielectric material, such as oxide, for example, may be maintained to separate the later-produced cells, film integrity and consistency may affect eventual device performance. For example, if the quality of the dielectric material is reduced due to detrimental contamination or incorporation of other materials, electrical leakage can occur between cells.

Conventional technologies may include gas delivery schemes in which many of the gases are delivered to the processing chamber through similar fluid lines. This may require increased purge operations to ensure that residual precursors for each layer do not negatively impact subsequent formation. However, these purging operations may increase processing time. For example, for an initial stack including 74 pairs of layers, even a purge operation of ten seconds between the depositions may increase overall processing time by more than ten minutes. Consequently, production may slow to about one wafer per hour or less. The present technology overcomes these issues by separating fluid delivery lines and incorporating precursor diversion, which may reduce pump operations performed during processing.

Although the remaining disclosure will routinely identify specific deposition and cleaning processes utilizing the disclosed technology, it will be readily understood that the systems and methods are equally applicable to other deposition, etching, and cleaning chambers, as well as processes as may occur in the described chambers utilizing a variety of precursor sources for deposition, etching, cleaning, or other operations. Accordingly, the technology should not be considered to be so limited as for use with these specific deposition processes or chambers alone. The disclosure will discuss one possible system and chamber that may include fluid systems according to embodiments of the present technology before additional variations and adjustments to this system according to embodiments of the present technology are described.

Figure 1:
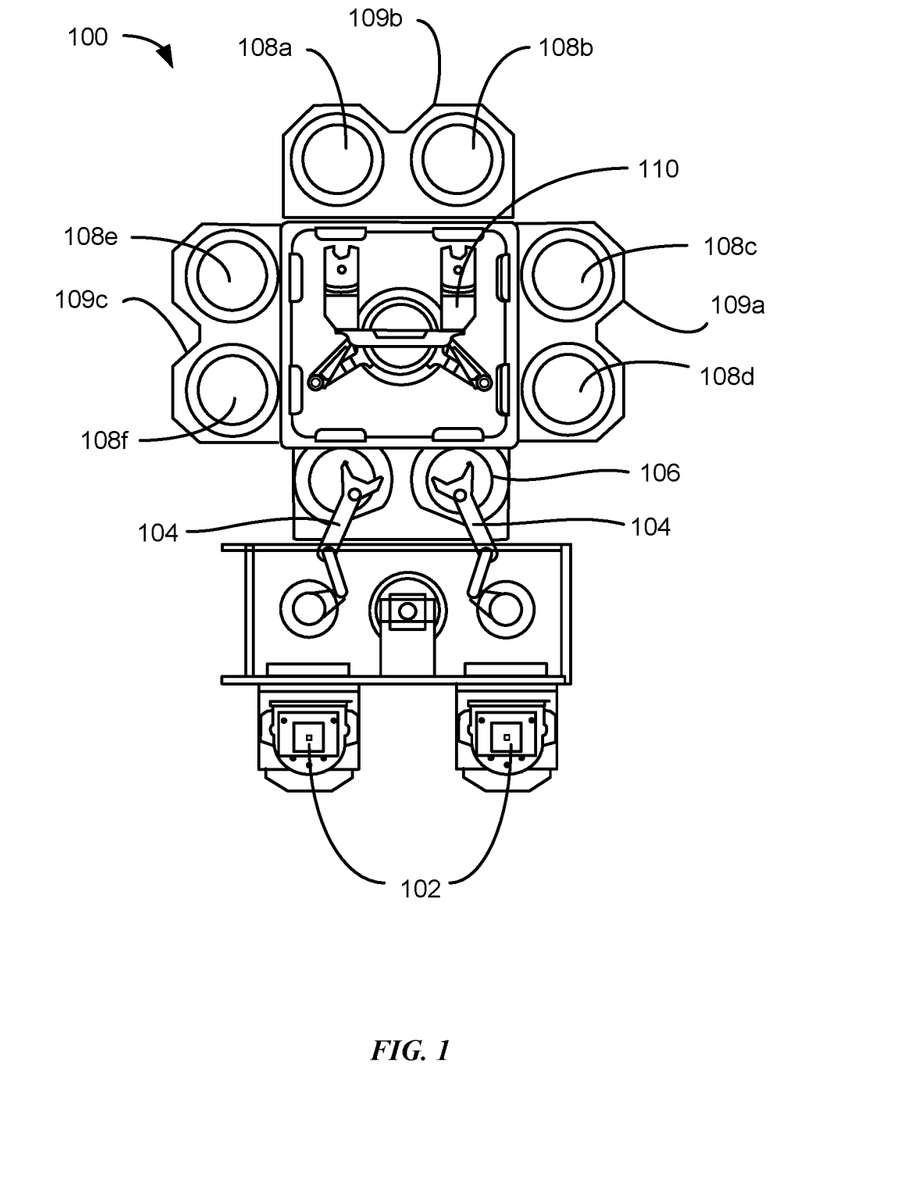
FIG. 1 shows a top plan view of an exemplary processing system according to some embodiments of the present technology.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
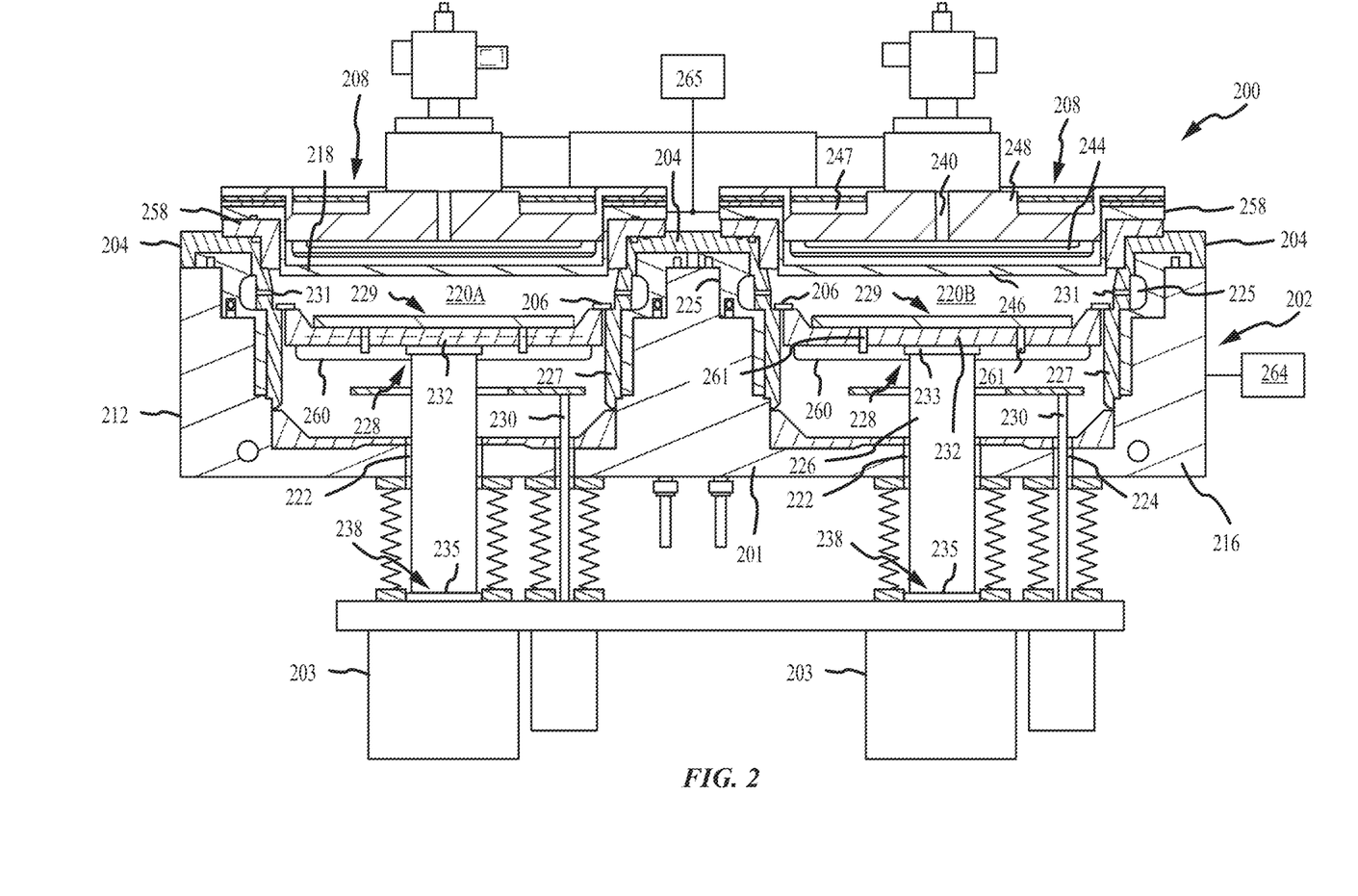
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include remote plasma sources according to embodiments of the present technology, and as may be explained further below. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. For example, the precursor distribution system may include a remote plasma source 209. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the precursor distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
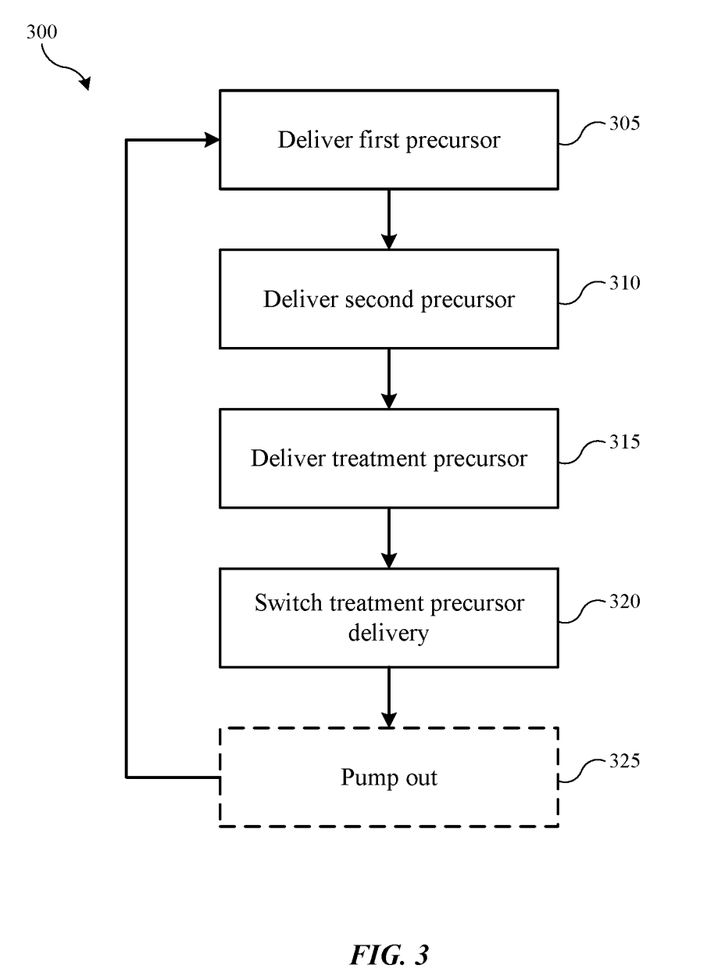
FIG. 3 shows selected operations in a processing method according to some embodiments of the present technology.
Figure 4:
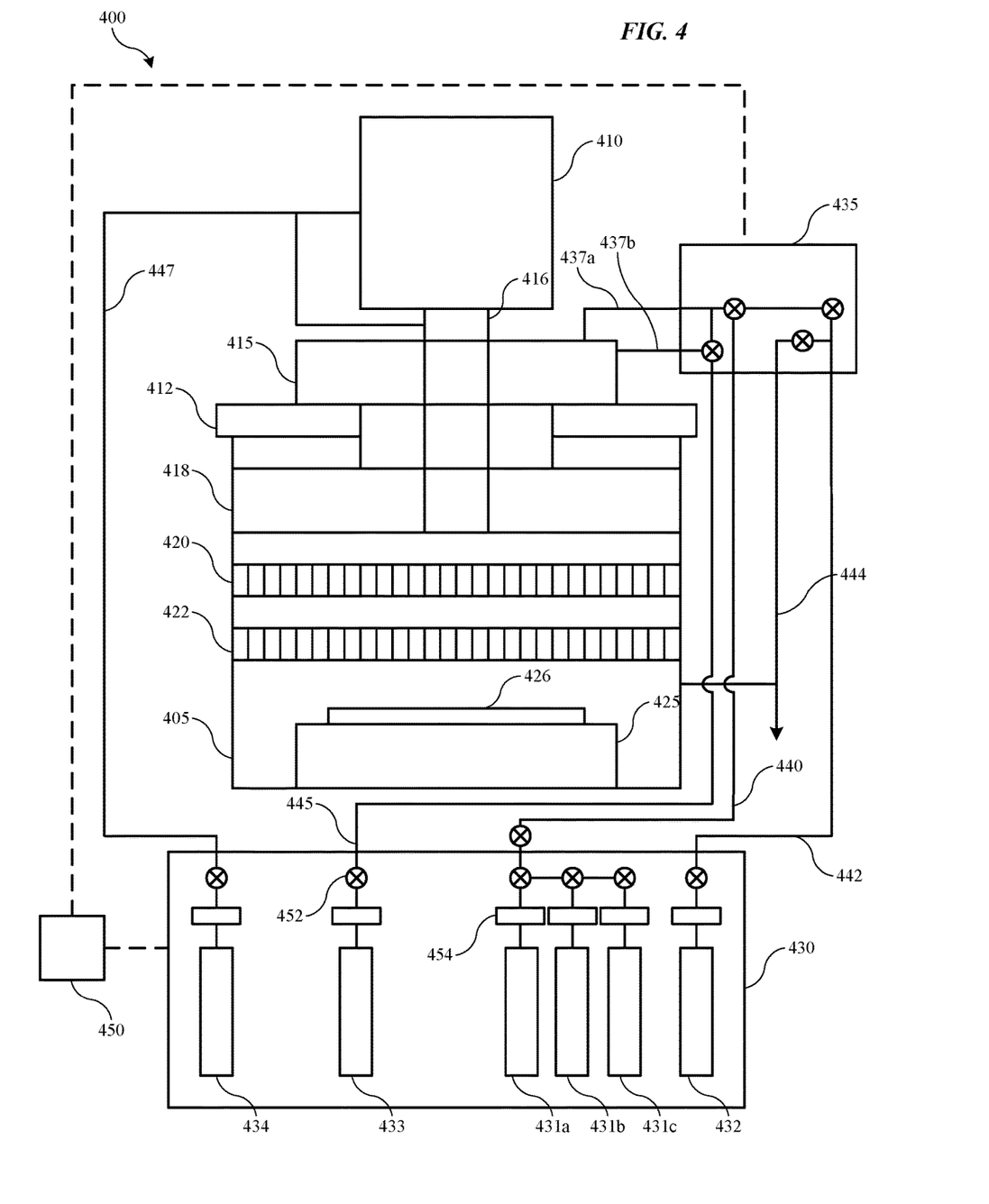
FIG. 4 shows a schematic cross-sectional view of an exemplary processing system according to some embodiments of the present technology.

The chamber discussed previously may be used in performing exemplary methods including deposition methods. Turning to FIG. 3 is shown exemplary operations in a method 300 according to some embodiments of the present technology. Method 300 may include one or more operations prior to the initiation of the method, including front end processing, deposition, gate formation, etching, polishing, cleaning, or any other operations that may be performed prior to the described operations. The method may include a number of optional operations, which may or may not be specifically associated with some embodiments of methods according to the present technology. For example, many of the operations are described in order to provide a broader scope of the structural formation, but are not critical to the technology, or may be performed by alternative methodology as will be discussed further below. Method 300 describes operations for fluid delivery and processing in an exemplary system shown schematically in FIG. 4, the illustrations of which will be described in conjunction with the operations of method 300. It is to be understood that FIG. 4 illustrates only partial schematic views, and a processing system may contain any number of components or configurations as illustrated in the figures, as well as alternative structural aspects that may still benefit from operations of the present technology Method 300 may or may not involve optional operations to develop the semiconductor structure to a particular fabrication operation or prepare the system for processing a semiconductor substrate. It is to be understood that method 300 may be performed in any number of semiconductor processing systems according to the present technology, and FIG. 4 illustrates one exemplary configuration of a fluid delivery setup that may be utilized to perform operations according to the present technology. For example, although certain line locations and couplings are illustrated, it is to be understood that any number of modifications and arrangements are similarly encompassed by the present technology. Although the remaining disclosure will reference formation of stacks of layers, such as for vertical memory formation, it is to be understood that the system of FIG. 4 may be used for any number of other processing operations including etching and cleaning operations, for example. After an overview of system 400, the specific operations of method 300 will be further described.

FIG. 4 may illustrate a semiconductor processing system 400 configuration for performing etching or deposition operations, such as method 300. The figure may include any aspect of system 200 described previously, and may illustrate additional details of the system as described above, including a gas panel and fluid delivery configuration. For example, system 400 may include a processing chamber 405 and a remote plasma source 410, which may be coupled with a lid stack 412 of the processing chamber. The lid stack 412 may include any number of components as previously described including an output manifold 415, a gasbox 418, a blocker plate 420, and a faceplate 422. An isolator may be positioned between the output manifold and the gasbox as illustrated, and remote plasma source 410 may be seated on output manifold 415, or may include an additional isolator or adapter 416 as illustrated. The system may also include a pedestal or substrate support 425 on which a substrate 426 may be seated for processing. Any of these components may include any of the features or characteristics of components described above.

In some embodiments, components downstream of the gasbox 418, such as the blocker plate 420 and the faceplate 422 may be characterized by a plurality of apertures defined through the components. In some embodiments no other component may be included between the gasbox and the blocker plate as illustrated, such as an additional distributer or blocker plate having only a central aperture. When additional components are included, which may only include a central aperture, a dead zone may form between the gas box and the additional component. Accordingly, by removing any such components, improved fluid flow and evacuation may be provided within the system.

Semiconductor processing system 400 may also include a gas panel 430, which may house a number of precursors, gases, or fluids, for performing the operations within chamber 405. For example, the precursors may include deposition, etchant, cleaning, and various carrier and other materials for use in semiconductor processing, and the following exemplary configuration is not intended to limit the materials that may be included within the gas panel. The example includes precursors that may be utilized in a process for depositing alternating layers of material on a substrate, although any of a variety of other processes may be performed. As illustrated, the gas panel may include a number of fluid lines extending to one or more access positions on the chamber. The fluid or transmission lines may include any number of materials including plated lines or other coated materials to resist, limit, or prevent interaction with precursors delivered through the lines.

The fluid lines may couple the precursor sources of the gas panel 430 with one or more locations of the chamber, or other components for further delivery. For example, system 400 may include an input manifold 435 fluidly coupling one or more precursor sources of the gas panel with the output manifold 415. Input manifold 435 may include one or more valves or internal fluid lines for fluidly coupling any inlet transmission lines with any delivery line, for example. A delivery line 437 may extend from the input manifold to the output manifold, and as explained further below, more than one delivery line 437 may be included in embodiments of the present technology. Precursor sources within the gas panel 430 may include any number of precursors that may be used in semiconductor processing. For example, a first set of precursor sources 431 may be coupled with a first transmission line 440 extending from the first set of precursor sources with the delivery line 437. The first transmission line 440 may extend to the input manifold, which may fluidly couple the first transmission line with the delivery line as illustrated. A second set of precursor sources 432 may be coupled with a second transmission line 442, which may fluidly couple the precursor sources 432 with the delivery line 437. Similar to the first transmission line 440, the second transmission line 442 may extend to the input manifold 435, which may fluidly couple the first transmission line with the delivery line as illustrated.

As illustrated, the second transmission line 442 may be switchably coupled between the delivery line 437 and an exhaust line 444 of the semiconductor processing system. Exhaust line 444 may extend to a foreline or exhaust system of the processing chamber, such as pumping system 264 described above. A third set of precursor sources 433 may be included, and may be coupled with the inlet manifold 435 with a third transmission line 445. Additionally, a fourth set of precursor sources 434 may be included, and may be coupled proximate the remote plasma source 410 as illustrated with a fourth transmission line 447. The fourth transmission line 447 may deliver the fourth set of precursors through the remote plasma source 410 and/or to a bypass location, such as to output manifold 415 or adapter 416 as illustrated. It is to be understood that any of the numbered lines may be a first, second, third, or fourth line in embodiments of the present technology, and the numbering and identification of the figures is not intended to limit any aspect of the technology or claims, which may interchangeably describe any line with any numbering in embodiments encompassed by the present technology.

To operate a variety of aspects of the processing system 400, a controller 450 may be included in some embodiments. Controller 450 may variously include a central processing unit and memory, which may be of any kind, and which may be operated by or with any accessory devices, as may be included in any system described. The memory may include any number of specific instructions for performing one or more aspects of any method or operation described, including method 300, or which may be performed in system 400, or any other system. The controller 450 may be configured and communicatively coupled with any aspect of the system, including the gas panel 430 and the inlet manifold 435 as illustrated. The precursor sources may be coupled with valves 452 and flow controllers 454 as illustrated, and controller 450 may operate any or all of these components, along with any other valve or aspect of the system to perform any aspect of processing. For example, the controller 450 may operate delivery of any precursor from the first set of precursor sources, the second set of precursor sources, the third set of precursor sources, and the fourth set of precursor sources.

The sets of precursor sources may include any number of precursors, and are not intended to be limited by the illustration. For example, the precursor sources may include any number of processing precursors, as well as any number of treatment precursors, carrier gases, or other precursors for semiconductor processing. One non-limiting example will be explained with regards to method 300, which may be a method of forming alternating layers of material on a substrate, such as for stacked memory. For example, the first set of precursor sources 431 may include a process precursor 431*a* and a carrier precursor 431*c*. Continuing the example, the second set of precursor sources 432 may include a treatment precursor.

As explained previously, stacked film formation may include the deposition or formation of alternating layers of material, which may include any of the materials described above. In one example, the layers may include a silicon-containing layer, such as polysilicon, and an oxygen-containing layer, such as silicon oxide. In some embodiments, a treatment operation may be performed with a nitrogen-containing material in between the deposition of the two layers. To limit an effect or integration of the nitrogen material in the silicon-containing layer, a purge or pump down operation may be performed to clear the chamber and fluid lines of residual nitrogen-containing material. Some conventional configurations may include the nitrogen-containing precursor, such as ammonia, nitrous oxide, nitrogen, or any other nitrogen-containing precursor, coupled with the same transmission line as one or more of the processing precursors, such as the silicon-containing precursor. However, due to the location of the gas panel, the fluid lines may span several feet before delivering precursors to the chamber. To exhaust the nitrogen-containing precursor from the transmission line prior to delivering the silicon-containing precursor may take many seconds of time, which may increase overall throughput as described above. The present technology may overcome these delays by separating the treatment precursor from one or both, or all, transmission lines delivering the processing precursors. Consequently, methods of semiconductor processing may be performed with reduced queue times.

Method 300 may be or include a deposition process that may be performed in system 400. Although the following example will describe a deposition process of alternating layers of silicon oxide and polysilicon, it is to be understood that any known stacked layers may be formed utilizing system 400, such as by utilizing alternate or additional precursors with the first set of deposition precursors or the second set of deposition precursors. Similarly, etching methods or cleaning methods may also be performed by utilizing alternate or additional precursors as the first set of processing precursors and the second set of processing precursors in embodiments encompassed by the present technology.

Method 300 may include delivering a first precursor to a processing chamber of a semiconductor processing system at operation 305. The first precursor may be any processing precursor, such as a silicon-containing precursor or an oxygen-containing precursor for the example of the alternating materials stack. In embodiments either the oxide layer or the silicon layer may be deposited first or second, and thus may constitute the first or second precursor in various embodiments of the present technology. In some embodiments, operation 305 may include delivering a silicon-containing precursor through a first transmission line and a first delivery line to a processing chamber of a semiconductor processing system to form a silicon-containing layer of material on a substrate. For example, a silicon-containing precursor may be included in precursor source 431*a*, and which may be delivered through first transmission line 440 to input manifold 435, where it may be flowed to delivery line 437*a* and then dispersed into the chamber.

In some embodiments one or more additional precursors may be delivered with the silicon-containing precursor or the first precursor. For example, with a silicon-containing layer, a dopant may be included in the deposited film to affect one or more film properties or characteristics. Thus, precursor source 431*b* may include a precursor for doping, including p-type doping or n-type doping, and may include any number of dopant precursors such as a boron-containing precursor, such as borane or diborane, a phosphorous containing precursor, such as phosphine, or any number of materials or elements. One or more additional precursors may also be included, such as inert or carrier precursors, including argon, helium, or other materials, and may be included in precursor source 431*c*. One or more valves or mass flow controllers may be utilized to adjust or exclude flow of one or more of these precursors.

A second deposition operation may be performed by delivering a second precursor, such as a second processing precursor, at operation 310. For example, an oxygen-containing precursor may be delivered through a second transmission line and a second delivery line to the processing chamber of the semiconductor processing system to form an oxygen-containing layer of material on the substrate, and which may be formed overlying the silicon-containing layer. The oxygen-containing precursor may be a silicon-and-oxygen-containing precursor in some embodiments, such as tetraethyl orthosilicate, among other precursors. Continuing the example using exemplary system 400, an oxygen-containing precursor may be included in precursor source 433, and which may be delivered through third transmission line 445 to input manifold 435, where it may be flowed to delivery line 437*a* and then dispersed into the processing chamber. In some embodiments the oxygen-containing precursor or second precursor may be delivered into the chamber through a different or second delivery line 437*b*, which may limit contamination between the precursors that may residually remain within any of the transmission or delivery lines. In other embodiments the oxygen-containing precursor or second precursor may be delivered to a separate input manifold, for example, before being delivered to the output manifold 415.

Although any number of variations in the film formation may occur, and different deposition, etching, or processing methods may similarly be performed, in some embodiments in which alternating layers of materials are formed including an oxide layer, a treatment process may also be performed on the oxygen layer. For example, a nitrogen treatment may be performed utilizing a nitrogen-containing precursor as previously described. A treatment precursor, which may be a nitrogen-containing precursor, may be delivered through a third transmission line at operation 315. For example, a nitrogen-containing precursor may be one of the precursors of the second set of precursor sources 432, and may be delivered through second transmission line 442 to input manifold 435.

As previously described, some conventional technologies may deliver the treatment precursor through the same transmission line as the silicon-containing precursor, which may reduce the number of transmission lines. However, the nitrogen-containing precursor may impact the silicon-containing material formation if residual nitrogen-containing precursor, or other treatment precursor, is not fully exhausted from the transmission line prior to formation of the next layer of silicon-containing material. The pump out may take an extended period of time, which may increase overall queue times. By utilizing a separate transmission line, such as second transmission line 442, the present technology may reduce the pump down time required. Additionally, the present technology may improve delivery times for a treatment operation by including a diversion line, such as exhaust line 444, which may allow the flow of the nitrogen-containing precursor to begin prior to a chamber delivery start time. For example, as previously described, second transmission line 442 may extend from the second set of precursor sources 432 to the input manifold 435, where it may be delivered to one of the delivery lines 437. The inlet manifold may also divert the flow of the treatment precursor to the exhaust line. Hence, the second transmission line 442 may be switchably coupled with a delivery line 437 or the exhaust line 444 either at or upstream of the inlet manifold 435 as illustrated.

In some embodiments, flow of the treatment precursor may begin during delivery of one of the processing precursors, such as the oxygen-containing precursor, for example. For example, during delivery of the oxygen-containing precursor to the processing chamber, the treatment precursor, such as the nitrogen-containing precursor may be delivered through the second transmission line 442 and flowed through the exhaust line 444, which may bypass the processing chamber and deliver the fluid to the system foreline or exhaust. This may bring the precursor several feet closer to the chamber, depending on the distance from the gas channel, which may reduce time to deliver the precursor to the chamber. After delivery of the oxygen-containing precursor has completed, delivery of the treatment precursor may continue through the second transmission line, but the connection may be switched from the exhaust line to a delivery line at operation 320, allowing the treatment precursor to enter the processing chamber and treat the oxygen-containing film. Again, any other treatment operation or flow operation may occur through the delivery system illustrated, and which is similarly encompassed by the present technology. In some embodiments delivery of the treatment precursor may be performed subsequent operation 310, or delivery of a processing precursor, for example, although the present technology may reduce flow times through the transmission lines by utilizing the diversion line to exhaust.

Some film formations including stacks of alternating films may produce interfacial layers. For example, including an amount of silicon-containing precursor at the initiation of the treatment operation may improve an interface layer between the oxygen-containing layer and the subsequent silicon layer. While a shared transmission line may afford inclusion of residual silicon-containing precursor when the treatment precursor is delivered, the present technology may separate these transmission lines. However, first transmission line 440 may still include a residual amount of silicon-containing precursor subsequent that delivery operation. Accordingly, in some embodiments, by utilizing the same delivery line 437a for both the first transmission line 440 for the silicon-containing precursor and the second transmission line 442 for the treatment precursor, this incorporation may still be performed.

For example, in some embodiments when treatment precursor is initially delivered through the delivery line 437a, such as when switched from the exhaust line, or while initially delivering the precursor, inert precursor from precursor source 431c may be flowed through first transmission line 440, which may purge residual silicon-containing material within that line into delivery line 437a. Utilizing flow controllers and valves associated with the different sources, the inert precursor may be flowed while additional silicon-containing precursor or dopant precursor may or may not be flowed. This may then deliver the residual precursor into the chamber to facilitate production of the interface layer. The interface layer included may be less than or about 20 Å of material, and due to the length of the first transmission line, residual silicon-containing precursor within this line may be sufficient to produce the desired thickness of interfacial material, which may include exposure of the oxide layer to treatment precursor, such as ammonia, and residual silicon-containing precursor, such as silane or some other silicon-containing precursor. In some embodiments the inert precursor may be continued to be delivered even after purging residual silicon-containing precursor, which may limit back streaming of treatment precursor into the first transmission line. If allowed, residual treatment precursor, such as a nitrogen-containing precursor, may produce nitrogen incorporation into the silicon-containing film, which may affect subsequent removal operations.

A pump down or purge operation may optionally be performed at optional operation 325, which may remove any residual treatment precursor from the system. Unlike conventional technology, where further purging is required through multiple transmission lines, the present technology may not include as extensive pump down. Because the treatment precursor may be delivered through a separate transmission line, once valves are closed off, only the delivery lines may be purged with the processing chamber. Consequently, in some embodiments the pump down operation may be performed in less than or about 10 seconds, and may be performed in less than or about 8 seconds, less than or about 6 seconds, less than or about 5 seconds, less than or about 4 seconds, less than or about 3 seconds, less than or about 2 seconds, less than or about 1 seconds, less than or about 0.5 seconds, or less. The method may then be repeated for any number of processing cycles to make any number of pairs of layers of material. Hence, throughput may be improved to greater than one wafer per hour, including greater than or about 1.5 wafers per hour, greater than or about 2 wafers per hour, or more depending on the number of layers produced.

As illustrated in the figures, a remote plasma source 410 may be included in the systems, which may be used in processing, such as with etching operations, or during chamber cleaning operations. When not in use, some precursors delivered may back stream into a volume of the remote plasma source or the components providing a delivery path for plasma effluents delivered from the source. For example, any of the processing precursors or the treatment precursor may flow into the output manifold and at least partially flow up through the adapter 416 or into the remote plasma source 410. The precursors may then flow into the processing region in subsequent operations, which may contaminate other operations being performed or other materials being formed.

Accordingly, in some embodiments, the present technology may include a fourth set of precursor sources 434, which may include an inert gas, which may be flowed to produce a flow curtain, which may limit or prevent back streaming of other precursors. For example, an inert gas may be flowed through fourth transmission line 447, and which may be flowed through the remote plasma source itself or may bypass the source to flow into the chamber. In either scenario, the precursor may flow through a central aperture of the output manifold to limit or prevent any gases from flowing up into the volume. The inert gas may be flowed during any of the other delivery operations, such as with the first precursor delivery, the second precursor delivery, or the treatment precursor. By utilizing equipment and methods according to embodiments of the present technology, throughput may be improved while additionally improving film quality and material formation.

One or more computing devices or components may be adapted to provide some of the desired functionality described throughout by accessing software instructions rendered in a computer-readable form. The computing devices may process or access signals for operation of one or more of the components of the present technology, such as the gas panel mass flow controllers or any of the valves in the system, for example. When software is used, any suitable programming, scripting, or other type of language or combinations of languages may be used to perform the processes described. However, software need not be used exclusively, or at all. For example, some embodiments of the present technology described above may also be implemented by hard-wired logic or other circuitry, including but not limited to application-specific circuits. Combinations of computer-executed software and hard-wired logic or other circuitry may be suitable as well.

Some embodiments of the present technology may be executed by one or more suitable computing device adapted to perform one or more operations discussed previously. As noted above, such devices may access one or more computer-readable media that embody computer-readable instructions which, when executed by at least one processor that may be incorporated in the devices, cause the at least one processor to implement one or more aspects of the present technology. Additionally or alternatively, the computing devices may include circuitry that renders the devices operative to implement one or more of the methods or operations described.

Any suitable computer-readable medium or media may be used to implement or practice one or more aspects of the present technology, including but not limited to, diskettes, drives, and other magnetic-based storage media, optical storage media, including disks such as CD-ROMS, DVD-ROMS, or variants thereof, flash, RAM, ROM, and other memory devices, and the like.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a transmission line" includes a plurality of such lines, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of semiconductor processing comprising:
    delivering a first deposition precursor through a first transmission line and a first delivery line to a processing chamber of a semiconductor processing system to form a first layer of material on a substrate;
    delivering a treatment precursor through a second transmission line and an exhaust line, wherein delivering the treatment precursor to the exhaust line occurs during delivery of the first deposition precursor; and
    switching delivery of the treatment precursor from the exhaust line to a second delivery line fluidly coupled with the processing chamber.

2. The method of semiconductor processing of claim 1, wherein the first delivery line and the second delivery line are the same delivery line.

3. The method of semiconductor processing of claim 1, further comprising:
    delivering a second deposition precursor through a third transmission line and a third delivery line to the processing chamber of the semiconductor processing system to form a second layer of material on the substrate.

4. The method of semiconductor processing of claim 3, wherein the second delivery line and the third delivery line are the same delivery line.

5. The method of semiconductor processing of claim 1, further comprising:
    delivering an inert precursor through a fourth transmission line extending to a location proximate a remote plasma unit coupled with the processing chamber, wherein the inert precursor is delivered into the processing chamber, and wherein the inert precursor is delivered during delivery of the first deposition precursor.

6. A method of semiconductor processing comprising:
    delivering a silicon-containing precursor through a first transmission line and a first delivery line to a processing chamber of a semiconductor processing system to form a silicon-containing layer of material on a substrate;
    delivering an oxygen-containing precursor through a second transmission line and a second delivery line to the processing chamber of the semiconductor processing system to form an oxygen-containing layer of material on the substrate;
    delivering a treatment precursor through a third transmission line and the first delivery line to the processing chamber of the semiconductor processing system, wherein the first transmission line and the third transmission line are coupled with the first delivery line through an input manifold, and wherein the third transmission line is switchably coupled with an exhaust line at the input manifold, wherein an inert precursor is fluidly coupled with the first transmission line;
    delivering the inert precursor through the first transmission line and the first delivery line while delivering the treatment precursor through the third transmission line and the first delivery line; and delivering a treatment precursor through the third transmission line and the exhaust line during delivery of the silicon-containing precursor or the oxygen-containing precursor.

7. The method of semiconductor processing of claim 6, wherein the treatment precursor comprises a nitrogen-containing precursor.

8. The method of semiconductor processing of claim 6, wherein a dopant precursor is delivered through the first transmission line during delivery of the silicon-containing precursor.

9. The method of semiconductor processing of claim 6, further comprising:

flowing the treatment precursor through the third transmission line and the exhaust line while delivering the oxygen-containing precursor to the processing chamber of the semiconductor processing system.

10. The method of semiconductor processing of claim 9, further comprising:

switching delivery of the treatment precursor from the exhaust line to the first delivery line.

11. The method of semiconductor processing of claim 6, wherein delivering the inert precursor through the first delivery line delivers a residual amount of silicon-containing precursor contained in the first delivery line to the processing chamber while delivering the treatment precursor.

12. The method of semiconductor processing of claim 6, further comprising:

exhausting the processing chamber subsequent delivering the treatment precursor; and repeating the method, wherein exhausting the processing chamber is performed in less than or about 5 seconds prior to delivering the silicon-containing precursor.

13. The method of semiconductor processing of claim 6, wherein the semiconductor processing system comprises:

a remote plasma source coupled with the processing chamber; and a fourth transmission line fluidly coupling an inert gas with the remote plasma source.

14. The method of semiconductor processing of claim 13, further comprising:

delivering inert gas through the fourth transmission line while delivering at least one of the silicon-containing precursor, the oxygen-containing precursor, or the treatment precursor.

* * * * *